United States Patent
Hashimoto et al.

(10) Patent No.: US 7,183,499 B2
(45) Date of Patent: Feb. 27, 2007

(54) ELECTROMAGNETIC WAVE SHIELDING SHEET, FRONT PANEL, AND DISPLAY

(75) Inventors: Daisuke Hashimoto, Shinjuku-ku (JP);
Fumihiro Arakawa, Shinjuku-ku (JP);
Yasuhiko Ishii, Shinjuku-ku (JP);
Yukihiro Kyoden, Shinjuku-ku (JP);
Eiji Oishi, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/557,145

(22) PCT Filed: Jun. 15, 2004

(86) PCT No.: PCT/JP2004/008356
§ 371 (c)(1),
(2), (4) Date: Nov. 17, 2005

(87) PCT Pub. No.: WO2004/114738
PCT Pub. Date: Dec. 29, 2004

(65) Prior Publication Data
US 2007/0007036 A1  Jan. 11, 2007

(30) Foreign Application Priority Data
Jun. 19, 2003  (JP) .............................. 2003-174547

(51) Int. Cl.
*H05K 9/00* (2006.01)
(52) U.S. Cl. ...................... 174/389; 174/392; 313/313; 313/479
(58) Field of Classification Search ................ 174/381, 174/389, 392; 361/816, 818; 313/313, 479
See application file for complete search history.

(56) References Cited

U.S. PATENT DOCUMENTS

| | | | | |
|---|---|---|---|---|
| 4,215,258 A | * | 7/1980 | Nelson et al. | 219/740 |
| 5,841,227 A | * | 11/1998 | Terpin | 313/479 |
| 6,262,364 B1 | * | 7/2001 | Yoshikawa et al. | 174/389 |
| 6,410,846 B1 | * | 6/2002 | Benn, Jr. | 174/391 |
| 6,417,619 B1 | * | 7/2002 | Yasunori et al. | 313/582 |
| 6,448,492 B1 | * | 9/2002 | Okada et al. | 174/389 |
| 6,621,003 B2 | * | 9/2003 | Yoshida et al. | 174/389 |
| 6,884,936 B2 | | 4/2005 | Takahashi et al. | |
| 2004/0113532 A1 | * | 6/2004 | Oishi et al. | 313/110 |

FOREIGN PATENT DOCUMENTS

| | | |
|---|---|---|
| JP | A 08-025864 | 1/1996 |
| JP | A 2000-183585 | 6/2000 |
| JP | A 2000-285926 | 10/2000 |
| JP | A 2003-060384 | 2/2003 |
| JP | A 2004-206076 | 7/2004 |
| TW | 535494 | 6/2003 |
| WO | WO 02/071824 A1 | 9/2002 |

\* cited by examiner

*Primary Examiner*—Hung V. Ngo
(74) *Attorney, Agent, or Firm*—Oliff & Berridge, PLC

(57) ABSTRACT

An electromagnetic wave shielding sheet includes a transparent substrate 11 and a metal layer 15 provided on one surface of the transparent substrate 11 through an adhesive layer 13. The metal layer 15 includes a mesh part 103 and a frame part 101 surrounding the mesh part 103. The frame part 101 includes at least one transparent part 105 that is a metal-layer-free area. Preferably, the transparent part 105 includes a metallic portion 105a in a geometric pattern. Light transmitted by or reflected from the transparent part 105 is detected, thereby the transparent part 105 can be used as a register mark for detecting the position of the mesh part 103.

12 Claims, 4 Drawing Sheets

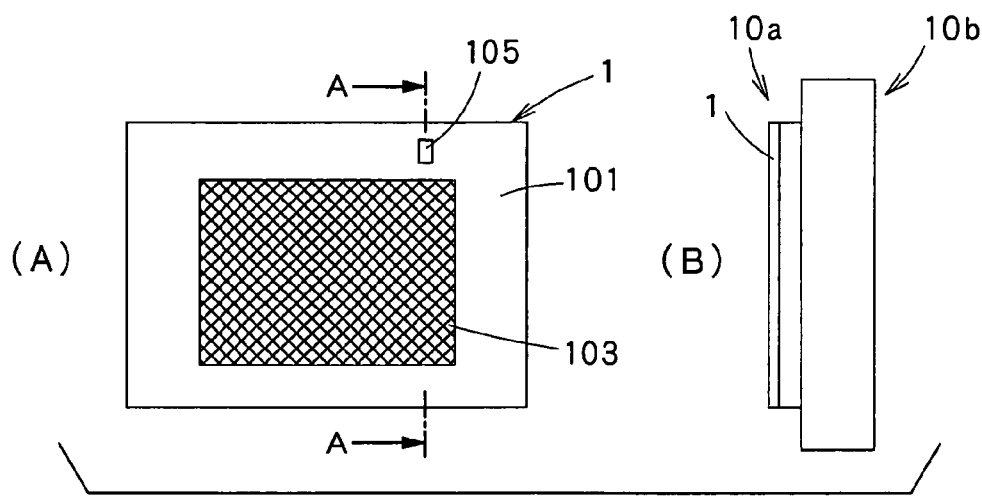
F I G. 1
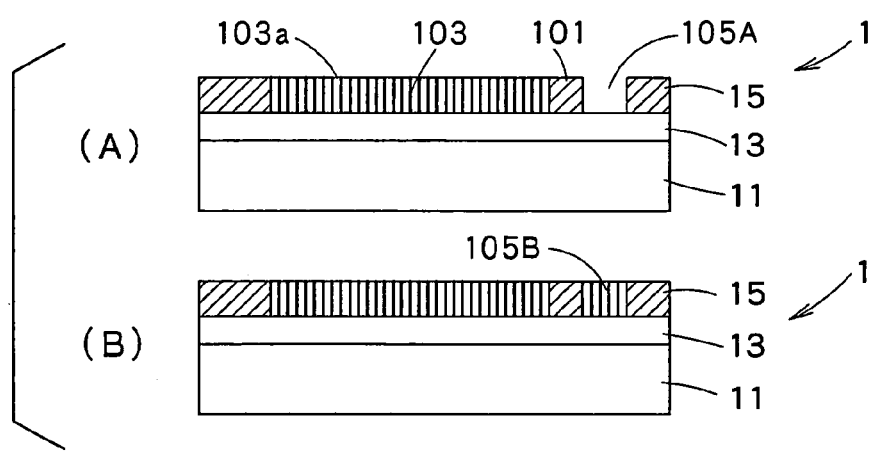
F I G. 2
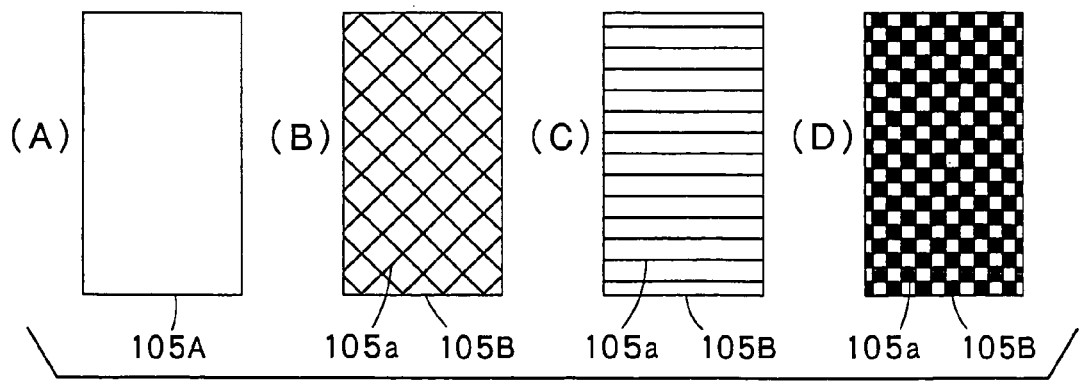
F I G. 3

ELECTROMAGNETIC WAVE SHIELDING SHEET, FRONT PANEL, AND DISPLAY

FIELD OF THE INVENTION

The present invention relates to an electromagnetic wave shielding sheet that is mounted on the front of a display such as a cathode ray tube (CRT) or a plasma display panel (hereinafter referred to as a PDP) in order to shield electromagnetic waves emitted from the display, and, more particularly, to an electromagnetic wave shielding sheet that is excellent in storage properties and, when being assembled together with other members, shows good aligning properties, to a front panel, and to a display.

BACKGROUND ART

1. Background of the Invention

Advances in the performance of electrical and electronic equipment and the growing use of the same have increased electromagnetic interference (EMI) in recent years. Electromagnetic wave noises are broadly classified into conductive noise and radiant noise. There is a method for avoiding conductive noise, in which a noise filter or the like is used. On the other hand, since electromagnetic insulation of space is required to avoid radiant noise, there are such methods for avoiding radiant noise that the body of equipment is made from metal, that a metallic plate is inserted between circuit bases, and that cables are covered with metallic foil. These methods are effective in shielding electromagnetic waves emitted from circuits or power blocks, but are unsuitable for shielding electromagnetic waves emitted from the front of displays such as CRTs and PDPs because metal is opaque. Metal shields not only electromagnetic waves with frequencies in the order of GHz ($10^9$ Hz) or less but also visible light (this is also electromagnetic waves with frequencies of $10^{14}$–$10^{15}$ Hz). Therefore, when a display is covered with metal, an image displayed on the display is covered as well.

A PDP display body is an assembly of a glass having a data electrode and a fluorescent layer, and a glass having a transparent electrode. When operated, such a display not only emits visible light that forms an image, but also produces large amounts of electromagnetic waves, near infrared rays, and heat. The required shielding efficiency for electromagnetic waves in a frequency band of 30 MHz to 1 GHz, emitted from the front of the display, is 30 dB or more.

In general, in order to transmit visible light that forms an image, but to shield electromagnetic waves in the above-described frequency band, an electromagnetic wave shielding sheet comprising a mesh metal layer is mounted as a front panel on a PDP. Into such a front panel, a near infrared-ray absorbing filter, and so on are usually incorporated in addition to the electromagnetic wave shielding sheet, and the finished front panel is mounted on the PDP display body. Further, since PDPs are characterized by large screen size, the sizes (outer dimensions) of the electromagnetic wave shielding sheets for use with PDPs are as large as 621×831 mm for 37 inch screens, and 983×583 mm for 42 inch screens, for example, and even larger ones are also available. Therefore, in the step of incorporating the electromagnetic wave shielding sheet into the front panel and in the step of mounting the front panel on the PDP display body, the electromagnetic wave shielding sheet has conventionally shown very poor aligning properties and handling properties.

An electromagnetic wave shielding sheet is usually produced in the following manner to enable mass production: on a belt-shaped continuous metallic sheet (continuous web), single pieces corresponding to one display screen are formed in a plane at equal spaces, and this continuous sheet is then cut into separate sheets, one sheet corresponding to one display screen.

When incorporating the electromagnetic wave shielding sheet into a PDP display, if it is not accurately aligned, moiré fringes tend to occur depending upon the angle of the meshes, so that the alignment of the electromagnetic wave shielding sheet requires high accuracy. Therefore, when the continuous web is cut into separate electromagnetic wave shielding sheets, it is necessary to accurately fix the cutting position and precisely control the orthogonality (the cutting position and the orthogonality are collectively referred to as positioning properties). Thus, the electromagnetic wave shielding sheet is required to have electromagnetic wave shielding properties, to show good storage properties during preservation or storage, to show good positioning properties when it is cut into separate sheets, and to show good aligning properties when it is assembled into a PDP display together with other members.

2. Prior Art

A conventionally known manner in which the alignment of a plurality of members is made when assembling a PDP display is as follows: a register mark is provided by printing; the printed register mark is illuminated; and the light reflected from or transmitted by the register mark is sensed to control the alignment (see Patent Document 1, for example). However, this manner is disadvantageous in that the additional step of printing the register mark is required, increasing the cost and lengthening the production time.

The following manner has also been known: when a continuous web is cut into separate electromagnetic wave shielding sheets, or when the alignment of an electromagnetic wave shielding sheet and other members is conducted when assembling a PDP display, the positioning of the electromagnetic wave shielding sheet is made by inserting a pin into a register mark that is a hole punched in the electromagnetic wave shielding sheet by a punching die, in correlation with the mesh part of the electromagnetic wave shielding sheet. However, this manner requires the production of a punching die only for punching a hole, and also the punching step. Moreover, a pinning machine is needed to perform the positioning of the electromagnetic wave shielding sheet.

Patent Document 1: Japanese Laid-Open Patent Publication No. 25864/1996.

DISCLOSURE OF THE INVENTION

The present invention was made in order to solve the aforementioned problems in the prior art. An object of the present invention is therefore to provide an electromagnetic wave shielding sheet that can be cut out from a continuous web with high positioning accuracy in the process of production and that can be placed on other members with high alignment accuracy when assembling a PDP display; a front panel; and a display.

The present invention is an electromagnetic wave shielding sheet comprising a transparent substrate, and a metal layer provided on one surface of the transparent substrate through an adhesive layer; the metal layer including a mesh part and a frame part surrounding the mesh part, and the frame part including a transparent part.

The present invention is the above-described electromagnetic wave shielding sheet, wherein the transparent part includes a metallic portion in a geometric pattern.

The present invention is the above-described electromagnetic wave shielding sheet, wherein the frame part includes a plurality of transparent parts at the desired spots.

The present invention is the above-described electromagnetic wave shielding sheet, wherein the transparent part extends along an entire periphery of the frame part.

The present invention is the above-described electromagnetic wave shielding sheet, wherein the transparent part serves as a register mark for detecting the position of the mesh part.

The present invention is the above-described electromagnetic wave shielding sheet, wherein the frame part, in its plan view, includes an area defined by two, larger and smaller, concentric similar squares and surrounds the mesh part, and the transparent part, in its plan view, is rectangular in shape.

The present invention is the above-described electromagnetic wave shielding sheet, wherein the rectangular transparent part is provided on one side of the frame part.

The present invention is the above-described electromagnetic wave shielding sheet, wherein the rectangular transparent part is provided at the intersection of two sides of the frame part.

The present invention is the above-described electromagnetic wave shielding sheet, wherein the frame part, in its plan view, includes an area defined by two, larger and smaller, concentric similar squares and surrounds the mesh part, and the transparent part, in its plan view, includes a belt-shaped area extending along one side of the frame part.

The present invention is the above-described electromagnetic wave shielding sheet, wherein the transparent part is formed of a fully open cavity.

The present invention is a front panel for a display, comprising an electromagnetic wave shielding sheet, wherein the electromagnetic wave shielding sheet comprises a transparent substrate, and a metal layer provided on one surface of the transparent substrate through an adhesive layer; the metal layer including a mesh part and a frame part surrounding the mesh part, and the frame part including a transparent part.

The present invention is a display provided with a front panel for a display that comprises an electromagnetic wave shielding sheet, wherein the electromagnetic wave shielding sheet comprises a transparent substrate, and a metal layer provided on one surface of the transparent substrate through an adhesive layer; the metal layer including a mesh part and a frame part surrounding the mesh part, and the frame part including a transparent part.

According to the present invention, there is obtained an electromagnetic wave shielding sheet that scarcely undergoes blocking even when it is produced in the form of a continuous web and is stored in the rolled-up state.

According to the present invention, when a continuous web composed of a plurality of mesh parts arranged in a plane, one mesh part corresponding to one display screen, is cut into separate electromagnetic wave shielding sheets, it is possible to perform the positioning of the continuous web with high accuracy.

According to the present invention, it is possible to align the electromagnetic wave shielding sheet and other members with ease and high accuracy, so that there can be efficiently produced at high yield a front panel excellent in alignment accuracy.

According to the present invention, it is possible to obtain a display that is accurately provided with the front panel and that can display an image without producing moiré fringes and is excellent in display performance.

BRIEF DESCRIPTION OF THE DRAWINGS

FIGS. 1(A) and 1(B) are views showing a front panel that is an electromagnetic wave shielding sheet of the present invention, and a display according to the present invention;

FIGS. 2(A) and 2(B) are cross-sectional views taken along line A—A in FIG. 1(A);

FIGS. 3(A) to 3(D) are plan views showing examples of the transparent part of the present invention;

BEST MODE FOR CARRYING OUT THE INVENTION

Figure 4:
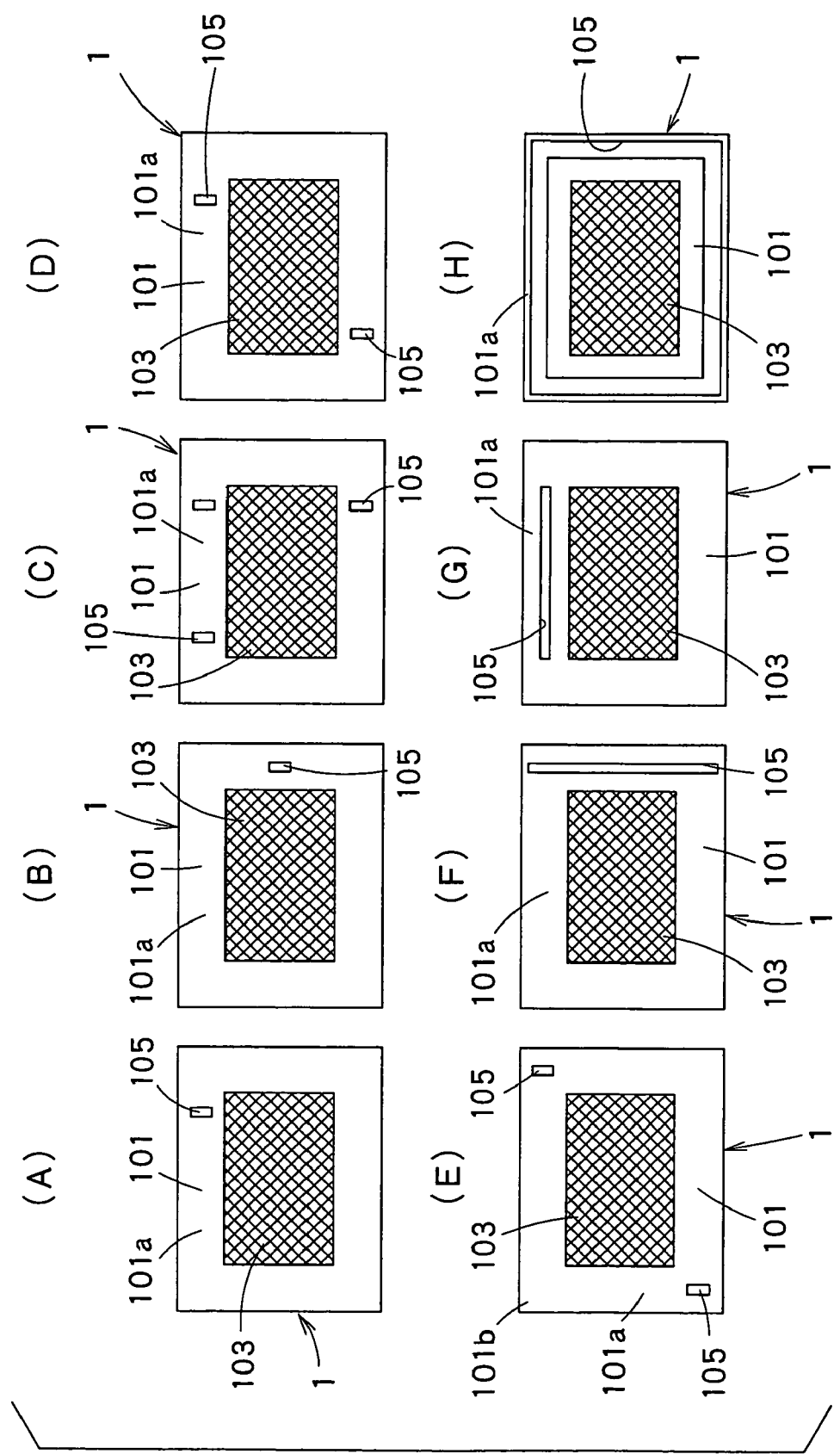
FIGS. 4(A) to 4(H) are plan views showing examples of the position and shape of the transparent part of the present invention.

Embodiments of the present invention will be described in detail with reference to the accompanying drawings.

FIG. 1 is a plan view of an electromagnetic wave shielding sheet of the present invention.

FIG. 2 is a cross-sectional view taken along line A—A in FIG. 1(A).

FIG. 3 is a plan view showing examples of the transparent part of the present invention.

(Whole Construction)

As shown in FIG. 1(A), a plan view, in FIG. 1(B), a side view, and in FIGS. 2(A) and 2(B), cross-sectional views, an electromagnetic wave shielding sheet 1 of the present invention comprises a transparent substrate 11 and a metal layer 15 provided on one surface of the transparent substrate 11 through an adhesive layer 13. As shown in FIG. 1(A), the metal layer 15 includes a mesh part 103 and a frame part 101 surrounding the mesh part 103, and the frame part 101 includes at least one transparent part 105 that is a metal-layer-free area. In the case where a front panel 10a into which the electromagnetic wave shielding sheet 1 is incorporated is mounted on the front of a display 10b, the mesh part 103 is grounded via the frame part 101 to shield electromagnetic waves emitted from the display 10b, and an image displayed on the display 10b is viewed through the mesh part 103 by an observer. In the display 10b, the transparent part 105 is usually hidden and is out of sight.

The cross-sectional views in FIGS. 2(A) and 2(B) show embodiments of the electromagnetic wave shielding sheet 1 of the present invention. Both electromagnetic wave shielding sheets are composed of a laminate of the transparent substrate 11/the adhesive layer 13/the metal layer 15 and are therefore the same in terms of layer construction, but are different in the construction of the transparent part 105.

The transparent part 105 may be formed of a fully open cavity, or include the metal layer partly remaining in a geometric pattern. The transparent part 105A shown in FIG. 2(A), a cross-sectional view, and in FIG. 3(A), a plan view, is so formed that the metal layer 15 in this part is fully removed to leave only the adhesive layer 13 laminated to the transparent substrate 11; this part is therefore transparent.

The transparent parts 105B shown in FIG. 2(B), a cross-sectional view, and in FIGS. 3(B), 3(C) and 3(D), plan views, include a geometrically patterned metallic portion 105a.

(Gist of the Invention)

Thus, in the electromagnetic wave shielding sheet 1 of the present invention, the transparent part 105, 105A, 105B is provided in the metal layer 15 including the mesh part 103 present in its center part (inner part) and the frame part 101 surrounding the mesh part 103. As will be described later, the transparent part 105, 105A, 105B can be used as a register mark in the following manner. Light is applied to the electromagnetic wave shielding sheet from one side thereof; the amount of light transmitted by or reflected from the transparent part 105, 105A, 105B is determined; the difference between this amount of light and the amount of light transmitted by or reflected from the frame part 101 is obtained, thereby detecting the position of the transparent part 105, 105A, 105B. Therefore, in this Specification, the transparent part 105, 105A, 105B is referred sometimes to as a register mark 105, 105A, 105B in functional descriptions.

Desirably, the transparent part 105A (register mark 105A) shown in FIG. 2(A) and FIG. 3(A), made by completely removing the metal layer 15, has, in its plan view, a rectangular shape and a small shorter side length.

If the length of the shorter side of the transparent part 105A is great, the electromagnetic wave shielding sheet, in sheet form that are rolled up or piled up, adhere to each other in the course of production or during storage due to the exposed adhesive layer 13 in the transparent part 105A, and a so-called blocking phenomenon occurs. If the electromagnetic wave shielding sheets 1 undergo blocking, it becomes difficult to separate the sheets 1, and if the blocking is severe, the sheets 1 are broken upon separation, and even the frame parts of the sheets 1 are broken, wrinkled or deformed. To avoid blocking, a slip-sheet such as paper is usually placed on the register mark having the exposed adhesive layer. However, the slip-sheet increases cost and demands the additional steps of placing and removing it.

To overcome this shortcoming, the metal part 15 is partly removed so that a metallic portion 105a remains in a geometric pattern such as meshes, dots, or slits. This is a transparent part 105B, shown in FIG. 2(B) and FIGS. 3(B) to 3(D), useful for the electromagnetic wave shielding sheet. By doing so, it is possible to leave, in the transparent part 105B, the metallic portion 105a in a geometric pattern such as meshes, dots, or slits even when the length of the shorter side of the transparent part 105B is great. In this case, since the metallic portion 105a remains closely, the adhesive of the adhesive layer 13 is never exposed largely, and the exposed adhesive is kept away, by the metallic portion 105a remaining in a geometric pattern, from any member or electromagnetic wave shielding sheet that is brought into contact with the transparent part 105B.

Further, even when the electromagnetic wave shielding sheet 1 is rolled up, or the sheets 1 in sheet form are piled up in the course of production or for storage, the facing surfaces of the sheet/sheets 1 do not easily adhere to each other. It is thus possible to minimize the occurrence of a blocking phenomenon (which the facing surfaces of a rolled-up sheet or of piled-up sheets unfavorably adhere to each other).

Furthermore, it is possible to use the transparent part 105 of the electromagnetic wave shielding sheet 1 of the present invention as a register mark 105 for the positioning of a continuous web 1a composed of a plurality of mesh parts arranged in a plane when cutting the continuous web 1a into separate sheets 1, and for the alignment of the sheet 1 and other members when assembling a PDP display.

Thus, in the whole process covering from the production of the electromagnetic wave shielding sheet 1 to the incorporation of it into a display, it is possible to attain improved positioning/alignment accuracy and high yield without demanding additional steps. Moreover, it is possible to simultaneously make the transparent part 105 and the mesh part 103, so that the number of the steps required remains unchanged. This Specification mainly describes the electromagnetic wave shielding sheet for use in a display such as a CRT or a PDP. It is however understood that the electromagnetic wave shielding sheet of the present invention can also be used for devices other than displays.

(Pattern and Dimensions of Register Mark)

The transparent part 105 of the electromagnetic wave shielding sheet 1 of the present invention is allowed to transmit or reflect light, thereby causing a difference between the amount of the transmitted or reflected light and the amount of light transmitted by or reflected from the frame part 101. To this end, the transparent part 105 includes no metallic portion 105a or includes a geometrically patterned metallic portion 105a.

FIG. 3(A) shows the transparent part 105A including no metallic portion 105a. The length of the shorter side of the transparent part 105A is made greater than 0 mm in order to make this part transparent, and not more than approximately 3 mm, preferably not more than 2 mm. The transparent part 105A can have any longer side length, as long as this length is greater than 0 mm with which transparency is ensured, and there is no upper limit to this length, because the length of the longer side of the transparent part 105A is sustained by the shorter side.

In the case where the transparent part 105 includes the metallic portion 105a in a geometric pattern, any pattern can be employed for this geometric pattern. For example, the geometric pattern of the metallic portion 105a may be meshes as shown in FIG. 3(B), stripes as shown in FIG. 3(C), or dots as shown in FIG. 3(D). The metallic portion 105a remaining in a geometric pattern keeps the exposed adhesive in the transparent part 105B away, at a constant distance, from any adjacent object, and, at the same time, prevents the adhesive from having a large exposed surface. There is, therefore, no limitation on the area of the transparent part 105B, and this part can have any area and any side length. The distance between two lines of the metallic portion 105a in a geometric pattern may be so determined that the metallic portion 105a remaining in a geometric pattern can prevent direct contact between the exposed adhesive and any object brought into contact with the transparent part 105, and the distance is greater than 0 mm, with which transparency is ensured, and not more than 1 mm, preferably not more than 0.5 mm. Since the shorter side sustains the length of the longer side of the transparent part 105, the transparent part 105 can have any longer side length, as long as this length is greater than 0 mm, with which transparency is ensured, and there is no upper limit to this length.

FIG. 4 is a plan view showing examples of the position and shape of the transparent part of the present invention.

(Position and Shape of Mark)

At least one transparent part 105 (register mark 105) is sufficient for the electromagnetic wave shielding sheet 1 of the present invention. The transparent part 105 in the desired shape in its plan view is formed as a metal-layer-free area (that is, a cavity) at the desired spot in the metal layer 15 constituting the frame part. Alternatively, the metallic portion 105*a* in a geometric pattern may be present in the metal-layer-free area. In this case, it is possible to adopt any geometric pattern. In the upper side 101*a*, including no mesh part 103, of the frame part 101 surrounding the mesh part 103, a transparent part 105 that is rectangular in shape may be provided, as shown in FIG. 4(A), in the direction in which the sheet 1 is run (horizontal direction in the figure) in the process of production. In the frame part 101 shown in FIG. 4(B), a transparent part 105 that is rectangular in shape is provided in a side 101*a* on the right-hand side of the mesh part 103. As shown in FIG. 4(C), two rectangular transparent parts 105 may be provided in the upper side 101*a* of the frame part 101, and one rectangular transparent part 105, in the lower side 101*a* of the frame part 101. As shown in FIG. 4(D), one rectangular transparent part 105 may be provided in the upper side 101*a* of the frame part 101, and the other rectangular transparent part 105, in the lower side 101*a* of the frame part 101. As shown in FIG. 4(E), two rectangular transparent parts 105 may be provided at the intersections 101*b* of two sides 101*a* of the frame part 101, and, as shown in FIG. 4(F), a belt-shaped transparent part 105 may be provided in the right-hand side 101*a* of the frame part 101. As shown in FIG. 4(G), a belt-shaped transparent part 105 may be provided in the upper side 101*a* of the frame part 101, and as shown in FIG. 4(H), a transparent part 105 may be provided on the entire outer periphery of the frame part 101 surrounding the mesh part 103. In FIG. 4(H), the frame part 101 and the peripheral part 101*a* are formed on a transparent substrate 11 through an adhesive layer 13. The rectangular or belt-shaped register mark 105 has linearity vertical to the direction in which the continuous web 1*a* that has been rolled up is unrolled and run. The transparent part 105 may be in the shape of, for example, a polygon such as a triangle, square (rectangle), pentagon or hexagon, and an L-, square-frame- or cross-shaped transparent part 105 may also be used. The frame part 101 is defined by two, larger and smaller, concentric similar squares 101*e*, 101*f*, and surrounds the mesh part 103.

Figure 5:
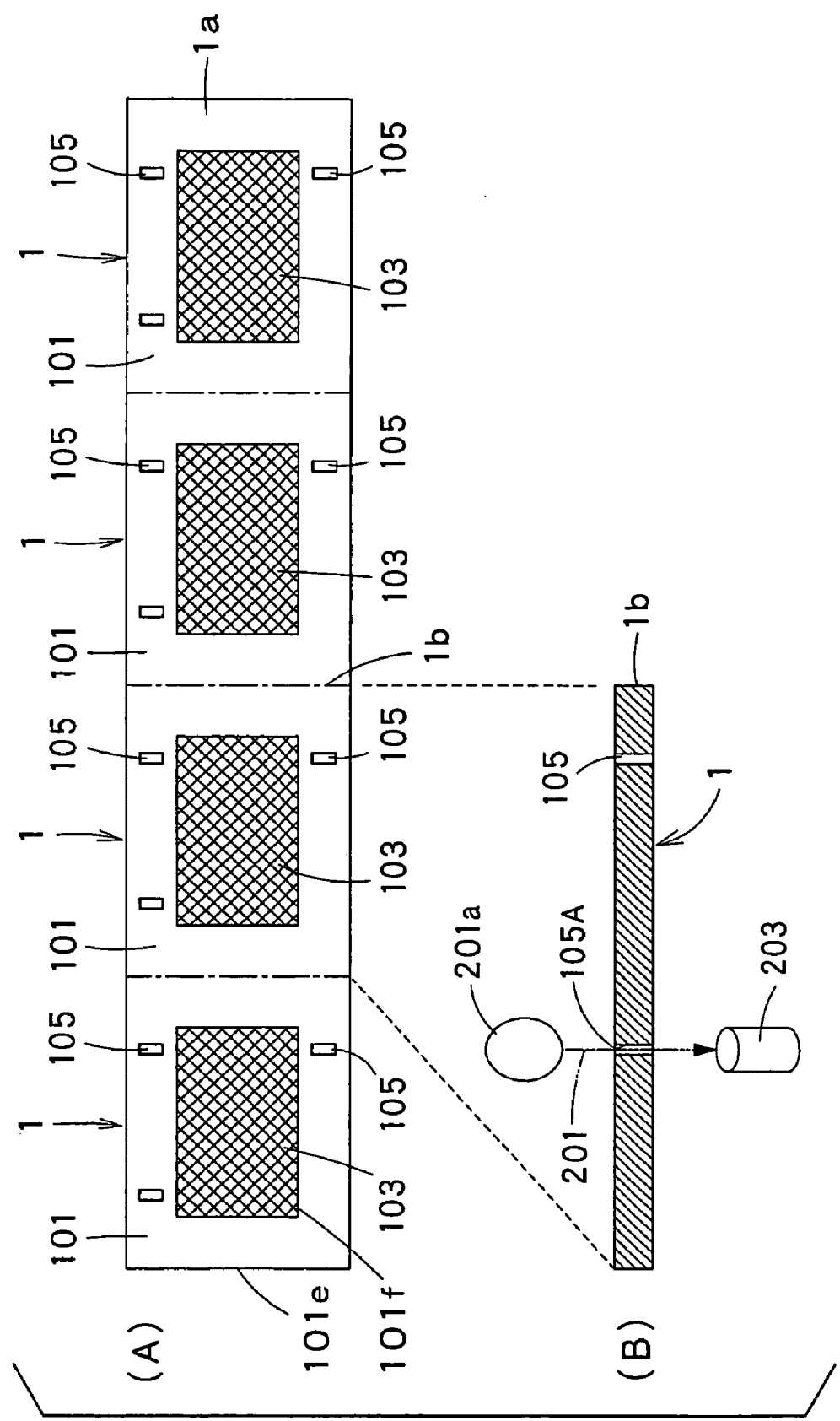
FIGS. 5(A) and 5(B) are views illustrating how a continuous web is cut into separate sheets while sensing the transparent part.

FIGS. 5(A) and 5(B) are a plan view and a cross-sectional view, respectively, illustrating how the transparent part 105 is sensed for cutting the continuous web 1*a* into separate sheets.

(Sensing of Mark)

FIG. 5(A) shows a part of the continuous web 1*a* composed of a plurality of the electromagnetic wave shielding sheets 1 that are arranged in a plane at equal spaces, each sheet including the mesh part 103 and the frame part 101 surrounding the mesh part 103. On the continuous web 1*a*, there is continuity between each two adjacent frame parts 101 (the borderline 1*b* between two adjacent frame parts, that is, the prescribed cutting plane line, is indicated by a dashed line). The transparent parts (register marks) 105 are provided in both the upper and lower sides, including no mesh part 103, of the frame part 101 in the direction in which the continuous web 1*a* is run.

A known method, that is, a general-purpose, low-cost, conventional method is used to sense the resister marks 105. FIG. 5(B) is a partially enlarged cross-sectional view of FIG. 5(A). Light 201 from a source 201*a* is continuously applied to the electromagnetic wave shielding sheet 1 on the continuous web 1*a*, and a receptor 203 receives the transmitted light. The light 201 passes through the register mark 105 and is sensed by the receptor 203. The intensity of the light transmitted by the register mark 105 and received by the receptor 203 and that of light transmitted by the frame part 101 and received by the receptor 203 become signal outputs, and the S/N ratio thereof is approximately 2.0 or more, preferably 3.0 or more. The continuous web 1*a* is cut into separate electromagnetic wave shield sheets 1 along the (prescribed) cutting plane lines (cutting parts 1*b*) that are fixed on the basis of this information on the positions of the register marks detected by the receptor 203. It is, therefore, possible to accurately cut the continuous web 1*a* and thus to obtain electromagnetic wave shielding sheets 1 with high accuracy.

Further, in the case where the register mark 105 is present between two adjacent mesh parts 103 of each two adjacent electromagnetic wave shielding sheets 1 constituting the continuous web 1*a*, as shown in FIG. 4(B), the mesh part 103 and the register mark 105 are made so that the intensity of light transmitted by the mesh part 103 is different from the intensity of light transmitted by the register mark 105. Namely, by making the signal outputs of the mesh part 103, the register mark 105, and the frame part 101 that are sensed by the receptor 203 differently, and by setting the slice level, it is possible to detect the positions of these three parts. Although explanation has been given by referring to transmitted light, reflected light may also be sensed, which is a commonly employed manner, by placing the receptor 203 in the position toward which the light 201 is reflected.

Furthermore, if a plurality of the register marks 105 are provided as shown in FIGS. 4(C), 4(D) and 4(E), it is possible to sense the register marks 105 independently of the direction in which the continuous web 1*a* is run.

Furthermore, if at least two register marks 105 are present on each electromagnetic wave shielding sheet 1 (in sheet form) obtained by cutting the continuous web 1*a*, it is possible to accurately specify the position and direction of the mesh part 103 thanks to two pieces of positional information given by the register marks. When assembling a PDP display, therefore, the alignment of the electromagnetic wave shielding sheet 1 and other members can be made easily and accurately in terms of vertical position and angle, so that it is possible to efficiently produce at high yield a PDP display excellent in alignment accuracy.

Figure 6:
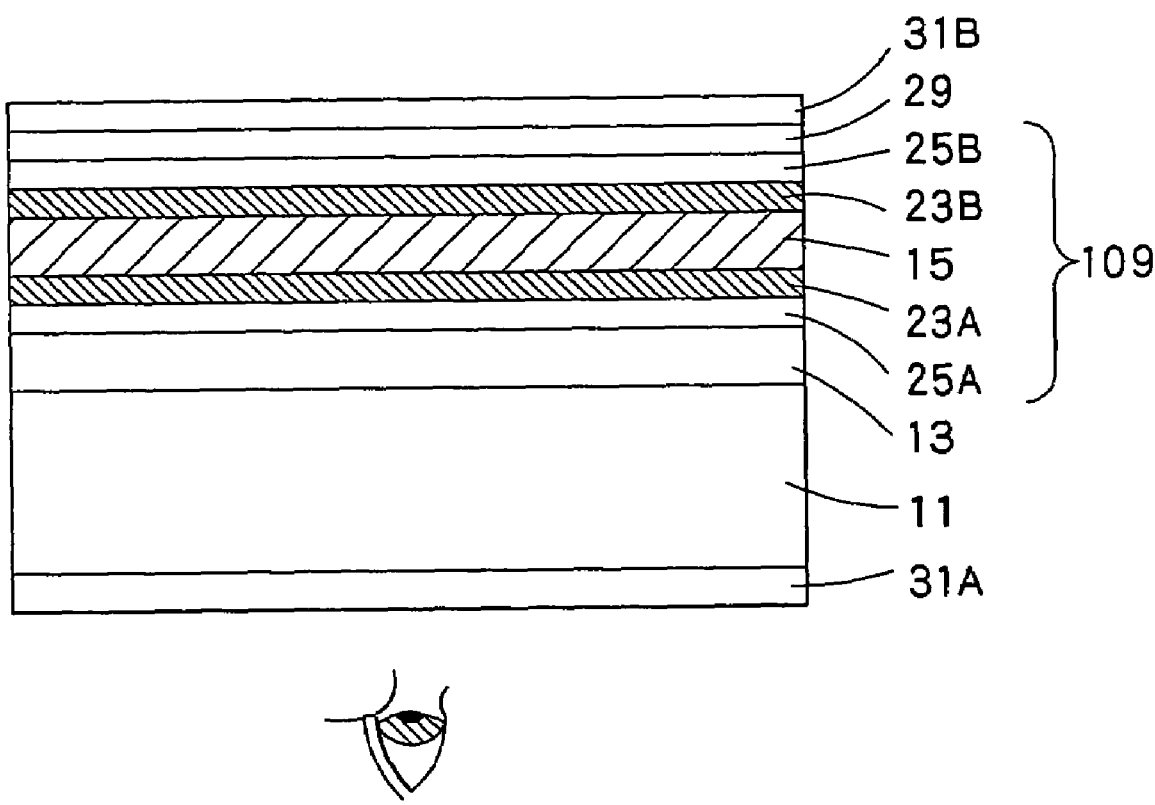
FIG. 6 is a cross-sectional view of an electromagnetic wave shielding sheet according to the present invention.

FIG. 6 is a cross-sectional view of an electromagnetic wave shielding sheet of the present invention.

(Layer Construction)

As shown in FIG. 6, a metal layer 15 is provided on one surface of a transparent substrate 11 through an adhesive layer 13. As mentioned previously, the metal layer 15 includes a mesh part 103 and a frame part 101 surrounding the mesh part 103, and the frame part 101 includes at least one transparent part 105.

A blackening treatment layer 23A and/or 23B may be provided on the metal layer 15. An anticorrosive layer 25A and/or 25B may be provided so that it covers the blackening treatment layer 23A and/or 23B. It is sufficient that the anticorrosive layer be provided at least on the blackening treatment layer 23A, 23B. The blackening treatment layer 23A is provided at least on the observation side surface of the metal layer 15.

The anticorrosive layer 25A, 25B has the function of preventing corrosion of the metal layer 15 and the blackening treatment layer 23A, 23B, enhances the blackness of the blackening treatment layer 23A, 23B, and prevents falling of the blackening treatment layer 23A, 23B. If the anticorrosive layer 25A, 25B is laminated to the transparent substrate 11 through the adhesive layer 13, it protects the adhesive layer 13. Moreover, the blackening treatment layer 23B and the anticorrosive layer 25B may be provided, as needed, on the surface of the metal layer 15 on the side opposite to the transparent substrate 11 side. Alternatively, the blackening treatment layers 23A and 23B and the anticorrosive layers 25A and 25B may be provided on both sides of the metal layer 15.

(Production Process)

By providing the blackening treatment layer 23A and, if necessary, the anticorrosive layer 25A and/or 25B at least on the observation side surface of the metal layer 15, a conductive member 109 is obtained. After laminating the conductive member 109 to the transparent substrate 11 with the adhesive layer 13, a resist layer having mesh patterns for the mesh part 103 and the transparent part 105 (register mark 105) is formed on the surface of the conductive member 109. Those portions of the conductive member 109 that are not covered with the resist layer are removed by etching, and the remaining resist layer is then removed (photolithography). There is produced an electromagnetic wave shielding sheet 1 by such a photolithographic process. By using the existing facilities and by continuously effecting many of these steps in the production process, it is possible to efficiently produce at high yield the electromagnetic wave shielding sheet 1 of good quality. Further, since it is possible to simultaneously make the transparent part 105 (register mark 105) and the mesh part 103 by the same method, the number of the steps required remains unchanged, and additional subsidiary materials are not needed.

Furthermore, the surface of the mesh part 103 of the metal layer 15 may be smoothed by the use of a smoothing layer 29, if necessary. A light rays absorbing layer 31A that absorbs visible light and/or near infrared rays with specific wavelengths may be provided on the surface of the smoothing layer 29, or a light rays absorbing layer 31B may be provided also on the back surface of the transparent substrate 11, as needed. If a front panel 10a comprising such an electromagnetic wave shielding sheet 1 is mounted on the front of a display 10b, it shields electromagnetic waves emitted from the display 10b, but sufficiently transmits visible light that forms an image, so that it is possible to satisfactorily view an image displayed on the display 10b.

Materials for the constituent layers of the electromagnetic wave shielding sheet 1 of the present invention, and the formation of these layers will be described hereinafter.

(Metal Layer)

For the metal layer 15 for shielding electromagnetic waves may be used a metal layer of gold, silver, copper, iron, nickel or chromium, for example, having electrical conductivity good enough to fully shield electromagnetic waves. The metal layer 15 may be a layer of one metal, a layer of an alloy, or a combination of metal layers. Examples of iron materials useful for the metal layer 15 include low-carbon steels such as low-carbon rimmed steels and low-carbon aluminum killed steels, Ni—Fe alloys, and invar alloys. If cathodic electrodeposition is conducted, copper or copper alloy foil is preferred because it can be easily formed by electrodeposition.

Rolled or electrolytic copper foil may be used as the copper foil, and electrolytic copper foil is preferred because of its uniformity in thickness and adhesion to the blackening treatment layer and/or the chromate (treatment) layer and because it can have a thickness as small as below 10 μm. The thickness of the metal layer 15 is approximately from 1 to 100 μm, and preferably from 5 to 20 μm. If the metal layer 15 has a thickness smaller than the above range, although it is easy to photolithographically process the metal layer 15 into meshes, the metal layer has an increased electrical resistance value and shows impaired electromagnetic wave shielding effect. When the metal layer 15 has a thickness greater than the above range, it is impossible to obtain the desired meshes with high precision. As a result, the substantial opening rate becomes low, which leads to a lower light transmission rate and a narrower viewing angle; image visibility thus becomes lower.

The surface roughness of the metal layer 15, as indicated by Rz value, is preferably from 0.5 to 10 μm. If the metal layer 15 has a surface roughness value lower than this range, the metal layer reflects extraneous light by mirror reflection even if it is blackened, and image visibility thus becomes lower. If the surface roughness value is greater than the above range, an adhesive or resist, upon application thereof, does not spread over the entire surface of the metal layer or involves air to produce air bubbles. The surface roughness Rz is a mean value of 10 measurements obtained in accordance with JIS-B0601.

(Blackening Treatment)

It is preferable to provide the blackening treatment layer 23A, 23B at least on the observation side of the conductive member 109 that corresponds to the mesh part 103 so that the electromagnetic wave shielding sheet 1 absorbs extraneous light, thereby improving the visibility of an image on a display. This layer can improve image contrast. The blackening treatment layer 23A, 23B may be formed by roughening and/or blackening the surface of the metal layer 15 by depositing a metallic oxide or sulfide, or by any of a variety of other techniques.

(Anticorrosive Layer)

It is preferable to provide the anticorrosive layer 25A and/or 25B on the surface of the metal layer 15 having at least the blackening treatment layer 23A, 23B in order to prevent corrosion of the metal layer 15 and/or the blackening treatment layer 23A, 23B and falling and deformation of the blackening treatment layer 23A, 23B. For the anticorrosive layer 25A, 25B may be used an oxide of nickel, zinc and/or copper, or a chromate treatment layer. A known plating process may be used to form a layer of an oxide of nickel, zinc and/or copper, and the thickness of the metallic oxide layer is approximately from 0.001 to 1 μm, preferably from 0.001 to 0.1 μm.

Chromate treatment is that a chromate treatment liquid is applied to an object to be treated. For the application of a chromate treatment liquid, a roll, curtain, squeeze, electrostatic spray, or dip coating method, for example, may be employed. After application, the chromate treatment liquid applied is not washed away with water and is dried as it is. Specific examples of the chromate treatment liquid include Alsurf 1000 (trademark of a chromate treatment agent, manufactured by Nippon Paint Co., Ltd., Japan) and PM-284 (trademark of a chromate treatment agent, manufactured by Nippon Parkerizing Co., Ltd., Japan). By subjecting the blackening treatment layer to chromate treatment, it is possible to further increase the effect of blackening treatment.

It is preferable to provide the blackening treatment layer 23A, 23B and the anticorrosive layer 25A, 25B at least on the observation side. If these layers are so provided, image contrast increases, and the visibility of an image on a display thus becomes better. The blackening treatment layer 23A, 23B and the anticorrosive layer 25A, 25B may be provided also on the other surface of the metal layer 15, that is, on the display face side. If so provided, these layers prevent the display from emitting stray light, so that further improved image visibility can be obtained.

Thereafter, the conductive member 109 and a transparent substrate 11 are laminated with an adhesive layer 13. The conductive member 109 is properly selected from those ones obtained by providing the blackening treatment layer 23A and/or 23B at least on the observation side of the metal layer 15, as needed, and further providing the anticorrosive layers 25A and/or 25B on these layers, if necessary.

(Transparent Substrate)

Any material can be used for the transparent substrate 11 as long as it has transparency, insulation properties, heat resistance, mechanical strength, and so on that can stand for service and production conditions. Examples of materials useful herein include polyester resins such as polyethylene terephthalate, polybutylene terephthalate, polyethylene naphthalate, ethylene glycol—terephthalic acid—isophthalic acid copolymers, terephthalic acid—cyclohexane dimethanol—ethylene glycol copolymers, and polyethylene terephthalate/polyethylene naphthalate co-extruded films; polyamide resins such as nylon 6, nylon 66, and nylon 610; polyolefin resins such as polypropylene and polymethyl pentene; vinyl resins such as polyvinyl chloride; acrylic resins such as polyacrylate, polymethacrylate and polymethylmethacrylate; imide resins such as polyimide, polyamide-imide, and polyether imide; engineering resins such as polyallylate, polysulfone, polyether sulfone, polyphenylene ether, polyphenylene sulfide (PPS), polyaramide, polyether ketone, polyether nitrile, polyether ether ketone, and polyether sulfide; polycarbonate; styrene resins such as ABS resin; and cellulose resins such as triacetyl cellulose.

The transparent substrate 11 may also be made from a copolymer resin or mixture (including an alloy) whose main components are resins selected from the above-enumerated ones, or may be a laminate of a plurality of layers. Although the transparent substrate 11 may be either an oriented or non-oriented film, a monoaxially or biaxially oriented film is preferably used to obtain improved strength. The thickness of the transparent substrate 11 is usually about 12 to 1000 μm, preferably 50 to 700 μm, and most preferably 100 to 500 μm. If the transparent substrate 11 has a thickness lower than the above range, it cannot have sufficiently high mechanical strength and unfavorably curls or slacks. When the transparent substrate 11 has a thickness greater than the above range, it shows unnecessarily high strength, which is in vain from the viewpoint of cost.

The transparent substrate 11 may be a film, sheet, or board composed of at least one layer of any of the above-enumerated resins, and these forms are herein collectively referred to as films. In general, films of polyester such as polyethylene terephthalate and polyethylene naphthalate are conveniently used for the transparent substrate 11 because they are excellent in both transparency and heat resistance and are inexpensive, and, of these, polyethylene terephthalate is most preferred. With respect to the transparency of the transparent substrate 11, the higher, the better, and it is preferable that the transparent substrate 11 has a transmittance of not less than 80% for visible light.

The surface of the transparent substrate film to be coated with an adhesive may be subjected to adhesion-improving treatment such as corona discharge treatment, plasma treatment, ozone treatment, flame treatment, primer (also called anchoring agent, adhesion-promoting agent, or adhesion-improving agent) coating treatment, preheating, dusting, vacuum deposition or alkali treatment. Fillers, plasticizers, antistatic agents, and so on may also be incorporated in the resin film, as needed.

(Process of Lamination)

The process of laminating the above-described layers is as follows: an adhesive or pressure-sensitive adhesive is applied to either the transparent substrate 11 or the conductive member 109, and is dried, if necessary; this one is pressed with or without heating, and is then optionally aged at a temperature between 30° C. and 80° C. A process that is called dry lamination by those skilled in the art is preferred. Ionizing radiation-curing resins that cure (react) in ionizing radiation such as ultraviolet rays (UV) or electron beams (EB) are also preferred.

(Adhesive)

Adhesives curable in heat or ionizing radiation such as ultraviolet rays or electron beams can be used for forming the adhesive layer 13 in a dry or non-solvent lamination process. Specific examples of heat-curing adhesives useful herein include two-part curable urethane, polyester urethane, polyether urethane, acrylic, polyester, polyamide, polyvinyl acetate, epoxy, and rubber adhesives. Of these, two-part curable urethane adhesives are preferred.

(Pressure-Sensitive Adhesive)

The adhesive layer 13 may be made from a pressure-sensitive adhesive. Any conventional pressure-sensitive adhesive can be herein used. Non-limitative examples of pressure-sensitive adhesives include natural rubber; synthetic rubber resins such as butyl rubber, polyisoprene, polyisobutylene, polychloroprene, and styrene-butadiene copolymer resins; silicone resins such as dimethyl polysiloxane; acrylic resins; vinyl acetate resins such as polyvinyl acetate and ethylene-vinyl acetate copolymers; urethane resins; acrylonitrile; hydrocarbon resins; alkylphenol resins; and rosin resins such as rosin, rosin triglyceride, and hydrogenated rosin.

(Formation of Adhesive Layer)

One of the above-enumerated resins for the adhesive or pressure-sensitive adhesive, or a mixture of any of these resins is made into a latex, an aqueous dispersion, or an organic solvent solution, which is then printed or applied by a known printing or coating method such as screen printing or comma coating, and is, if necessary, dried. The other member is placed on this layer, and pressure is applied, thereby forming the adhesive layer.

The thickness of the adhesive layer 13 (in the dry state) is approximately from 0.1 to 20 μm, preferably from 1 to 10 μm. After forming the adhesive layer 13, a laminating member is immediately laminated to the adhesive layer 13, and this laminate is aged at 300 to 120° C. for several hours to several days, or the adhesive layer is hardened. The adhesive layer 13 may be applied to either the transparent substrate 11 or the conductive member 109. It is preferable to provide the adhesive layer 13 on the roughened copper foil 15, which will serve as the metal layer 15, in the conductive member 109. In this case, the adhesive entirely spreads over the roughened surface of the copper foil 15, so that the laminate is prevented from containing air bubbles.

The mesh part 103 and the transparent part 105 that are formed by partly removing the metal layer 15 expose the adhesive layer 13 made from the adhesive or pressure-sensitive adhesive in the above-described manner. During the production or storage of the electromagnetic wave shielding sheets 1, if a strong force is exerted to them, the exposed adhesive layer 13 from one electromagnetic wave shielding sheet 1 adheres to the surface of another electromagnetic wave shielding sheet 1 that is in contact with the adhesive layer 13 of one electromagnetic wave shield sheet 1, and a so-called blocking phenomenon occurs. The mesh part 103 is inherently in the form of meshes, so that this part does not cause blocking. However, the transparent part 105 causes blocking, so that it is preferable to leave the metallic portion 105 in the transparent part 105a, as mentioned previously.

(Meshes)

The mesh part 103 is composed of a plurality of openings surrounded by lines. The openings may be in any shape selected from, for example, triangles, tetragons such as squares, rectangles, rhombs and trapezoids, pentagons, hexagons, polygons with sides in the number of n (n>6), circles, and ovals. A collection of a plurality of openings in the above-described shape forms meshes.

(Smoothing)

The thickness of the line part 103a of the mesh part 103 is the same as the thickness of the metal layer 15. The openings in the mesh part 103, made by removing the metal layer, form cavities, so that the conductive member 109 has irregularities as a whole. In the case where an adhesive or pressure-sensitive adhesive for the adhesive layer 13 is applied to the conductive member 109 in the subsequent step, the cavities are filled with this adhesive or pressure-sensitive adhesive. However, in the case where the electromagnetic wave shielding sheet 1 is attached to a display right after the formation of the mesh part 103, the irregularities remain and make workability poor. In this case, it is preferable to provide a smoothing layer 29 in order to fill the cavities to smooth the irregularities.

Any layer may be used for the smoothing layer 29 as long as it is highly transparent and is highly adhesive to the material for the mesh part and also to an adhesive that is used in the next step. It is however unfavorable that the smoothing layer 29 has a surface with protrusions, concavities or unevenness because when such a smoothing layer is mounted on the front of a display, moiré fringes, non-uniform interference bands, or Newton's rings occur. A preferable method for forming the smoothing layer 29 is as follows: after a thermosetting or ultraviolet-curing resin layer is formed, a releasable transparent substrate excellent in smoothness is layered on this resin layer; heat or ultraviolet light is applied to cure the resin; and the releasable substrate is then peeled off. The smoothness of the surface of the substrate is transferred to the surface of the smoothing layer 29, so that the smoothing layer 29 is to have a smooth surface.

Any resin can be used for the smoothing layer 29. Examples of resins useful herein include a variety of natural resins, synthetic resins, thermosetting resins, and ionizing radiation-curing resins. Of these, ultraviolet-light-curing acrylic resins are preferred because they are highly durable, have good coating properties, are easily smoothed, and form uniform layers.

(NIR Absorbing Layer)

A light absorbing agent capable of absorbing visible light and/or near infrared rays with specific wavelengths may be added to a resin that is used for forming the smoothing layer 29. If visible light with specific wavelengths is absorbed, the color tone of an image displayed is more properly corrected, and image visibility is thus improved. In general, visible light emitted from a PDP display is usually orange color light that is originated from the emission spectrum of neon atom, so that it is preferable to use a light absorbing agent that absorbs, to some extent, light with wavelengths around 590 nm and around the range of 780 to 900 nm. Examples of dyes useful for the light absorbing agent include cyanine compounds, phthalocyanine compounds, naphthalocyanine compounds, naphthoquinone compounds, and anthraquinone compounds. These dyes may be used either singly or as a mixture of two or more members. Near infrared rays are rays with specific wavelengths in the order of 780 to 1100 nm. Since these near infrared rays wrongly operate remote controllers, it is necessary to shield a display so that it does not radiate near infrared rays. It is desirable that 80% or more of near infrared rays in the wave range of 780 to 1000 nm be absorbed. Any near infrared rays absorbing agent (hereinafter referred to as an NIR absorbing agent) can be herein used. It is however necessary to use an agent that shows sharp absorption in the near infrared region, has high transmittance for light in the visible light range, and shows no great absorption of light with specific wavelengths in the visible light range. Dyes such as immonium compounds, diimmonium compounds, phthalocyanine compounds, and dithiol complexes may be used for the NIR absorbing agent.

In the case where no NIR absorbing agent is added to the smoothing layer 29, a commercially available film containing an NIR absorbing agent (e.g., trademark No. 2832 manufactured by Toyobo Co., Ltd., Japan) may be laminated with an adhesive. Alternatively, the NIR absorbing agent may be added to a polyester, polyurethane or acrylic resin, or to a thermosetting or ultraviolet-light-curing binder that cures as an epoxy, acrylate, methacrylate or isocyanate group reacts, followed by application. Thus, an NIR absorbing layer 31A, 31B is formed.

(AR Layer)

Further, although not shown in the figures, an anti-reflection layer (hereinafter referred to as an AR layer) may be provided on the observation side of the electromagnetic wave shielding sheet. The anti-reflection layer is for preventing reflection of visible light, and is composed of either a single layer or multiple layers. Many AR layers of both types are commercially available. To form a single AR layer, a layer (low refractive index layer) with a refractive index lower than the refractive index of the outermost layer of the electromagnetic wave shielding sheet is laminated. For the low refractive index layer, a layer of magnesium fluoride, silicon oxide, or the like is used. A multi-layered AR layer can be obtained by alternately laminating high refractive index layers and low refractive index layers. Examples of high refractive index layers include layers of niobium oxide, titanium oxide, zirconium oxide, and ITO, and examples of low refractive index layers include layers of magnesium fluoride and silicon oxide. Moreover, layers whose surfaces have fine irregularities that irregularly reflect extraneous light may also be used for the AR layer.

(Hard Coat Layer, Anti-Staining Layer, Anti-Glaring Layer)

A hard coat layer, an anti-staining layer, and an anti-glaring layer may further be provided on the anti-reflection (AR layer). The hard coat layer is a layer having a pencil hardness of H or more as determined by a pencil hardness test according to JIS K5400, and can be formed by curing a polyfunctional acrylate such as polyester acrylate, urethane acrylate or epoxy acrylate by the application of heat or ionizing radiation. The anti-staining layer is a water- and oil-repellent coat, and siloxane compounds, alkylsilyl fluoride compounds, or the like can be used for this layer. The anti-glaring layer is a layer having a surface with fine irregularities that irregularly reflects extraneous light.

(Production of Sheet)

The continuous web 1a in the shape of a belt, obtained in the above-described manner, is cut at the cutting parts 1b into separate electromagnetic wave shielding sheets 1 in sheet form.

The transparent part 105 (register mark 105) of the electromagnetic wave shielding sheet 1 is sensed, and the position of the transparent part 105 is thus detected to fix the position of the cutting part 1b at which the continuous web 1a is cut into separate sheets.

The electromagnetic wave shielding sheet 1 is attached to a transparent substrate such as a glass substrate, and is combined, as needed, with an NIR absorbing layer, an AR layer, a hard coat layer, an anti-staining layer and an anti-glaring layer; this assembly is used as a front panel 1a for a display 1b. For a large-sized display, a rigid panel with a thickness of 1 to 10 mm is used as the front panel 1a, while for a small-sized display such as a character display tube, a plastic film with a thickness of 0.01 to 0.5 mm is used as the front panel 1a. Thus, types of the front panel 1a may be properly selected depending upon the size of the display or the application of the front panel. In the above-described case, after assembling the electromagnetic wave shielding sheet 1 into the display front panel 1a, this front panel 1a is mounted on the front of the display 1b, so that the transparent substrate 11 is on the observation side. However, the electromagnetic wave shielding sheet 1 may be attached directly to the front face of the display 1b.

When mounting, on the display 1b, the electromagnetic wave shielding sheet 1 combined with other members, or when attaching the electromagnetic wave shielding sheet 1 to a transparent substrate such as a glass substrate, or when setting the electromagnetic wave shielding sheet 1 together with an NIR absorbing layer, an AR layer, a hard coat layer, an anti-staining layer and an anti-glaring layer, as needed, it is necessary to make the alignment of the electromagnetic wave shielding sheet 1 and the other members. This alignment can be made with ease and high accuracy due to the register mark 105 present on the electromagnetic wave shielding sheet 1, and the assembled display 10b scarcely produces moiré fringes, or the like and shows excellent display performance.

EXAMPLES

Example 1

Copper foil with a thickness of 10 μm was used as the conductive member 109 (serving also as the metal layer 15). This copper foil and a PET film "A4300" (trademark, polyethylene terephthalate manufactured by Toyobo Co., Ltd., Japan) with a thickness of 100 μm serving as the transparent substrate 11 were laminated with an adhesive layer 13 made from a two-part urethane adhesive, and this laminate was aged at 56° C. for 4 days. For the adhesive, "Takelack A-310" (trademark, manufactured by Takeda Chemical Industries, Ltd., Japan) made from a polyol was used as the main agent, and "A-10" (trademark, manufactured by Takeda Chemical Industries, Ltd., Japan) made from isocyanate was used as the curing agent. The adhesive was applied in such an amount that the adhesive layer after dried would have a thickness of 7 μm. Using the existing production line for a color TV shadow mask, in which a belt-shaped continuous web is photolithographically processed in a series of the steps of from masking to etching, the mesh part 103 was formed. Namely, a casein resist was firstly applied to the entire surface of the conductive member 109 by flow coating. The laminate of the conductive member 109 and the transparent substrate 11 was transferred to the next station, and a patterning plate whose details will be described below was placed on the laminate, followed by conducting contact exposure. The exposed laminate was then transferred from one station to another for development by water, for film-hardening treatment, and for baking at 100° C.

The above-described patterning plate is as shown in FIG. 5(A), in which the mesh parts 103, each one being in dimensions of 600 mm (width)×800 mm (length) and having square openings with a line width of 22 μm, a line distance (pitch) of 300 μm, and a bias angle of 49 degrees, are arranged at intervals of 900 mm, and the frame part 101 with a width of 50 mm surrounds each mesh part 103. Between each two adjacent mesh parts 103 are the continuously connected frame parts 101 that surround these mesh parts 103, and the distance between the two mesh parts 103 is 100 mm (before the continuous web is cut into separate electromagnetic wave shielding sheets in sheet form). Within the frame part 101, a transparent part 105 (that would serve as a register mark 105) was provided at the spot 10 mm distant in the width direction from the end of the mesh part 103, by forming a metal-layer-free area with a width of 10 mm and a length of 5 mm, including a metallic portion 105a in a geometric pattern with a line width of 8 μm, a line distance (pitch) of 500 μm, and a bias angle of 45 degrees (see FIG. 3(B) and FIG. 5(A)).

The laminate was transferred to the next station, and a ferric chloride solution having a Baumé degree of 42° at a temperature of 30° was sprayed over the laminate as an etchant. Thus, the laminate was etched to form openings. The laminate was then transferred from one station to another for washing of the laminate with water, for peeling and removal of the resist, and for drying at 100° C., thereby obtaining an electromagnetic wave shielding sheet 1 of Example 1.

Example 2

An electromagnetic wave shielding sheet 1 was obtained in the same manner as in Example 1, except that a laminate obtained by laminating a blackening treatment layer 23A made from copper-cobalt alloy particles with a mean particle diameter of 0.3 μm and an anticorrosive layer 25A made of a chromate (treatment) layer to the transparent substrate 11 side of a metal layer 15 made of a 10-μm thick electrolytic copper film was used as the conductive member 109.

Example 3

An electromagnetic wave shielding sheet 1 was obtained in the same manner as in Example 1, except that the transparent part 105 (that would serve as a register mark 105) was, as shown in FIG. 3(D), made to include a metallic portion in a dotted pattern equivalent to 40 dot percents at 133 lpi in the case of printing.

Example 4

An electromagnetic wave shielding sheet 1 was obtained in the same manner as in Example 1, except that the transparent part 105 (that would serve as a register mark 105) was made as a cavity by fully removing the metal layer and that the width and length of the rectangular transparent part 105 were made 10 mm and 2 mm, respectively (see FIG. 3(A)).

Example 5

An electromagnetic wave shielding sheet 1 was obtained in the same manner as in Example 1, except that the width and length of the rectangular transparent part 105 were made 10 mm and 3 mm, respectively.

Comparative Example 1

An electromagnetic wave shielding sheet 1 was obtained in the same manner as in Example 1, except that the transparent part 105 (that would serve as a register mark 5) was not provided.

(Evaluation)

Blocking tests and register-mark-sensing tests were conducted for evaluation.

In the register-mark-sensing tests, a conventional photosensor (for its conceptual view, see FIG. 5(B)) for use in a conventional sheet cutting machine was used. The sample that the position of the register mark could be detected was evaluated as acceptable, while the sample that the position of the register mark could not be detected was evaluated as unacceptable.

The blocking tests were carried out in the following manner: 50 mm×50 mm specimens including the transparent part were cut out from each sample; 10 specimens cut out from one sample were piled up in the same direction, and a pressure of 20 N/cm$^2$ was applied to this stack; the stack was stored at 60° C. for 2 days under the pressure. The sample that the specimens were easily separated was evaluated as acceptable, while the sample that the specimens tightly adhered to each other or could not be separated was evaluated as unacceptable.

(Results)

The result of the register-mark-sensing tests was that all the electromagnetic wave shielding sheets of Examples 1 to 5 were acceptable. On the other hand, the result of the blocking tests was as follows: the electromagnetic wave shielding sheets of Examples 1 to 4 were acceptable; as for the electromagnetic wave shielding sheet of Example 5, the specimens slightly adhered to each other but could be separated, and this blocking seemed to have no influence on quality, so that this electromagnetic wave shielding sheet was also evaluated as acceptable. Since no register mark had been provided in the electromagnetic wave shielding sheet of Comparative Example 1, the borderline between the mesh part and the frame part was used for positioning, and it was possible to make the positioning. The result of the blocking tests was acceptable.

Examples 6 to 10

Each one of the electromagnetic wave shielding sheets of Examples 1 to 5 was attached to one surface of a 3-mm glass plate with a pressure-sensitive adhesive, and a near infrared rays absorbing film (trademark No.2832) manufactured by Toyobo Co., Ltd., Japan was attached to the electromagnetic wave shielding sheet with a pressure-sensitive adhesive. An anti-reflection film (trademark TAC-AR1) manufactured by Dai Nippon Printing Co., Ltd., Japan was attached to the other surface of the glass plate with a pressure-sensitive adhesive, thereby obtaining a front panel 10*a*.

By using 100 sheets cut out from each one of the electromagnetic wave shielding sheets of Examples 1 to 5, the PDP display front panels 10*a* were assembled. It was possible to assemble all the 100 sheets into front panels 10*a* without causing any trouble, and the members of each front panel 10*a* were found to be excellent in alignment accuracy. As for the electromagnetic wave shielding sheet of Comparative Example 1, it experienced no trouble while it was cut into separate sheets because cutting was made by sensing both light transmitted by the frame part and light transmitted by the mesh part. However, out of the 100 front panels assembled, two were found to be poor in alignment accuracy. Thus, the yield of the front panel was proved to be lower.

Examples 11 to 15

Each one of the front panels 10*a* of Examples 6 to 10 was mounted on the front of a PDP display ("WOOO" manufactured by Hitachi, Ltd., Japan), thereby obtaining a display 10*b*. Each display 10*b* was made to display an image. Moiré fringes, glaring, and mirroring of extraneous light did not occur in all the images displayed, and the images were excellent in color tone and image visibility. Furthermore, all the front panels 10*a* were found to be excellent in electromagnetic wave shielding efficiency.

According to the present invention, even when the electromagnetic wave shielding sheet is produced in the form of a continuous web and is stored in the rolled-up state, a blocking phenomenon scarcely occurs; and when a continuous web composed of a plurality of electromagnetic wave shielding sheets that are arranged in a plane is cut into separate sheets, it is possible to accurately conduct positioning.

Further, according to the present invention, the alignment of all the constituent members of the front panel can be made with ease and high accuracy, so that it is possible to efficiently produce at high yield the front panel excellent in alignment accuracy.

Furthermore, according to the present invention, since it is possible to accurately mount the front panel on a display, no moiré fringes or the like are produced in an image displayed on the display, and the display shows good display performance.

The invention claimed is:

1. An electromagnetic wave shielding sheet comprising:
   a transparent substrate, and
   a metal layer provided on one surface of the transparent substrate through an adhesive layer;
   the metal layer including a mesh part and a frame part surrounding the mesh part, and
   the frame part including a transparent part.

2. The electromagnetic wave shielding sheet according to claim 1, wherein
   the transparent part includes a metallic portion in a geometric pattern.

3. The electromagnetic wave shielding sheet according to claim 1, wherein
   the frame part includes a plurality of transparent parts at the desired spots.

4. The electromagnetic wave shielding sheet according to claim 1, wherein
   the transparent part extends along an entire periphery of the frame part.

5. The electromagnetic wave shielding sheet according to claim 1, wherein the transparent part serves as a register mark for detecting the position of the mesh part.

6. The electromagnetic wave shielding sheet according to claim 1, wherein
the frame part, in its plan view, includes an area defined by two, larger and smaller, concentric similar squares and surrounds the mesh part, and the transparent part, in its plan view, is rectangular in shape.

7. The electromagnetic wave shielding sheet according to claim 6, wherein
the rectangular transparent part is provided on one side of the frame part.

8. The electromagnetic wave shielding sheet according to claim 6, wherein
the rectangular transparent part is provided at the intersection of two sides of the frame part.

9. The electromagnetic wave shielding sheet according to claim 1, wherein
the frame part, in its plan view, includes an area defined by two, larger and smaller, concentric similar squares and surrounds the mesh part, and the transparent part, in its plan view, includes a belt-shaped area extending along one side of the frame part.

10. The electromagnetic wave shielding sheet according to claim 1, wherein
the transparent part is formed of a fully open cavity.

11. A front panel for a display, comprising an electromagnetic wave shielding sheet, wherein the electromagnetic wave shielding sheet comprises:
a transparent substrate, and
a metal layer provided on one surface of the transparent substrate through an adhesive layer;
the metal layer including a mesh part and a frame part surrounding the mesh part, and
the frame part including a transparent part.

12. A display provided with a front panel for a display that comprises an electromagnetic wave shielding sheet, wherein the electromagnetic wave shielding sheet comprises:
a transparent substrate, and
a metal layer provided on one surface of the transparent substrate through an adhesive layer;
the metal layer including a mesh part and a frame part surrounding the mesh part, and
the frame part including a transparent part.

* * * * *